United States Patent
Weng et al.

(10) Patent No.: US 9,793,296 B2
(45) Date of Patent: Oct. 17, 2017

(54) METHOD FOR FABRICATING SUBSTRATE OF SEMICONDUCTOR DEVICE INCLUDING EPITAXIAL LAYER AND SILICON LAYER HAVING SAME CRYSTALLINE ORIENTATION

(71) Applicant: UNITED MICROELECTRONICS CORP., Hsin-Chu (TW)

(72) Inventors: Wen-Yin Weng, Taichung (TW); Cheng-Tung Huang, Kaohsiung (TW); Ya-Ru Yang, New Taipei (TW); Yi-Ting Wu, Taipei (TW); Yu-Ming Lin, Tainan (TW); Jen-Yu Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/296,027

(22) Filed: Oct. 17, 2016

(65) Prior Publication Data
US 2017/0040346 A1 Feb. 9, 2017

Related U.S. Application Data

(62) Division of application No. 14/469,566, filed on Aug. 26, 2014, now Pat. No. 9,508,799.

(51) Int. Cl.
*H01L 27/12* (2006.01)
*H01L 29/10* (2006.01)
(Continued)

(52) U.S. Cl.
CPC ...... *H01L 27/1207* (2013.01); *H01L 21/0217* (2013.01); *H01L 21/02164* (2013.01);
(Continued)

(58) Field of Classification Search
CPC ........... H01L 27/1207; H01L 21/76251; H01L 21/02433; H01L 21/02609; H01L 29/045; H01L 29/785
See application file for complete search history.

(56) References Cited

U.S. PATENT DOCUMENTS 6,972,478 B1 12/2005 Waite
7,060,585 B1 6/2006 Cohen et al.
(Continued)

OTHER PUBLICATIONS

Min Yang et al., "Hybrid-Orientation Technology (HOT): Opportunities and Challenges", IEEE Transactions on Electron Devices, vol. 53, No. 5, May 2006.

*Primary Examiner* — Michael Jung
*Assistant Examiner* — Mikka Liu
(74) *Attorney, Agent, or Firm* — Winston Hsu

(57) ABSTRACT

A method for fabricating substrate of a semiconductor device includes the steps of: providing a first silicon layer; forming a dielectric layer on the first silicon layer; bonding a second silicon layer to the dielectric layer; removing part of the second silicon layer and part of the dielectric layer to define a first region and a second region on the first silicon layer, wherein the remaining of the second silicon layer and the dielectric layer are on the second region; and forming an epitaxial layer on the first region of the first silicon layer, wherein the epitaxial layer and the second silicon layer comprise same crystalline orientation.

9 Claims, 3 Drawing Sheets

(51) Int. Cl.

| | | |
|---|---|---|
| *H01L 29/66* | (2006.01) | |
| *H01L 29/16* | (2006.01) | |
| *H01L 29/165* | (2006.01) | |
| *H01L 29/78* | (2006.01) | |
| *H01L 29/04* | (2006.01) | |
| *H01L 21/02* | (2006.01) | |
| *H01L 21/308* | (2006.01) | |
| *H01L 21/762* | (2006.01) | |
| *H01L 21/8234* | (2006.01) | |
| *H01L 21/84* | (2006.01) | |

(52) U.S. Cl.
CPC .. *H01L 21/02178* (2013.01); *H01L 21/02381* (2013.01); *H01L 21/02433* (2013.01); *H01L 21/02529* (2013.01); *H01L 21/02532* (2013.01); *H01L 21/02609* (2013.01); *H01L 21/02639* (2013.01); *H01L 21/3081* (2013.01); *H01L 21/76251* (2013.01); *H01L 21/823431* (2013.01); *H01L 21/845* (2013.01); *H01L 27/1211* (2013.01); *H01L 29/045* (2013.01); *H01L 29/1054* (2013.01); *H01L 29/16* (2013.01); *H01L 29/165* (2013.01); *H01L 29/1608* (2013.01); *H01L 29/6656* (2013.01); *H01L 29/66553* (2013.01); *H01L 29/66795* (2013.01); *H01L 29/785* (2013.01)

(56) References Cited

U.S. PATENT DOCUMENTS

| | | |
|---|---|---|
| 8,574,969 B2 | 11/2013 | Cohen et al. |
| 2007/0020864 A1 | 1/2007 | Chong |
| 2007/0187682 A1 | 8/2007 | Takeuchi |
| 2008/0274595 A1* | 11/2008 | Spencer ............ H01L 21/76283 438/154 |
| 2010/0159684 A1* | 6/2010 | Chang ............. H01L 21/823807 438/585 |

* cited by examiner

METHOD FOR FABRICATING SUBSTRATE OF SEMICONDUCTOR DEVICE INCLUDING EPITAXIAL LAYER AND SILICON LAYER HAVING SAME CRYSTALLINE ORIENTATION

CROSS REFERENCE TO RELATED APPLICATIONS

This application is a division of U.S. application Ser. No. 14/469,566 filed Aug. 26, 2014, and incorporated herein by reference in its entirety.

BACKGROUND OF THE INVENTION

1. Field of the Invention

The invention relates to a method for fabricating substrate of semiconductor device, and more particularly, to a method for fabricating a hybrid-orientation substrate.

2. Description of the Prior Art

Through the decades, ever-increasing silicon CMOS performance has been relying on device scaling, i.e., reducing channel length, gate oxide, and threshold voltage. Today, as very large scale integration (VLSI) technology enters the 65-nm node and beyond, power consumption has become a limiting factor. To circumvent this limitation, novel device structures and materials are widely pursued, such as FinFETs, vertical MOSFETs, high-k dielectric and/or metal gate, and most of all, various approaches for carrier-mobility enhancement. Process-strained silicon channels engineering by film deposition, trench isolation, silicidation and source/drain materials have been introduced in 90-nm technology. Higher carrier mobility from a new channel material, such as Ge, is also under study. Above all, a novel approach commonly referred to as hybrid-orientation technology (HOT) has been derived to improve carrier mobility through wafer and channel orientation optimization.

Despite the fact that HOT has received considerable attention because its fabrication processes are fully compatible with current VLSI technology without additional new materials, there are still many issues of device design and process integration for this new structure. These include device isolation, epitaxial quality and scalability, mixture of silicon-on-insulator (SOI) and bulk devices.

SUMMARY OF THE INVENTION

It is therefore an objective of the present invention to provide a hybrid-orientation substrate and fabrication method thereof for optimizing the carrier mobility of the device.

According to a preferred embodiment of the present invention, a method for fabricating substrate of a semiconductor device is disclosed. The method includes the steps of: providing a first silicon layer; forming a dielectric layer on the first silicon layer; bonding a second silicon layer to the dielectric layer; removing part of the second silicon layer and part of the dielectric layer to define a first region and a second region on the first silicon layer, wherein the remaining of the second silicon layer and the dielectric layer are on the second region; and forming an epitaxial layer on the first region of the first silicon layer, wherein the epitaxial layer and the second silicon layer comprise same crystalline orientation.

Another aspect of the present invention provides a substrate of semiconductor device, which includes: a first silicon layer having a first region and a second region defined thereon; an epitaxial layer on the first region; a dielectric on the second region; and a second silicon layer on the dielectric layer, in which the second silicon layer and the epitaxial layer comprise same crystalline orientation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
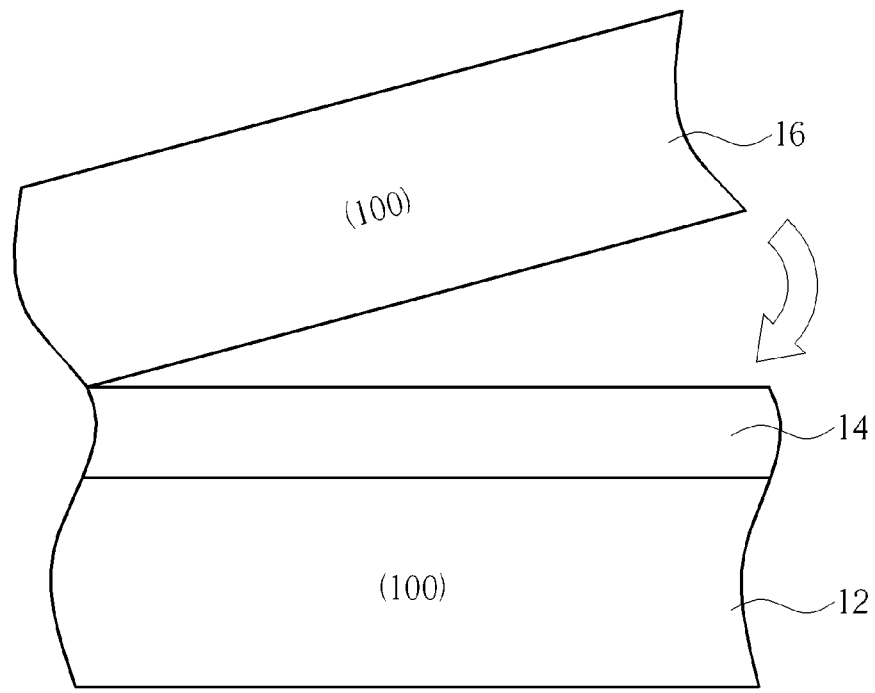
FIGS. 1-4 illustrate a method for fabricating substrate of a semiconductor device according to a preferred embodiment of the present invention.

Referring to FIGS. 1-4, FIGS. 1-4 illustrate a method for fabricating substrate of a semiconductor device according to a preferred embodiment of the present invention. As shown in FIG. 1, a first silicon layer 12 is provided, a dielectric layer 14 is then formed on the first silicon layer 12, and then a second silicon layer 16 is bonded to the dielectric layer 14 to forma silicon-on-insulator (SOI) structure. In this embodiment, the dielectric layer 14 is composed of silicon dioxide, aluminum oxide, or silicon nitride, and each one of the first silicon layer 12 and the second silicon layer 16 is preferably composed single crystal silicon. Preferably, both the first silicon layer 12 and the second silicon layer 16 includes a (100) crystalline orientation and a <100> channel direction before the second silicon layer 16 is bonded to the dielectric layer 14.

Figure 2:
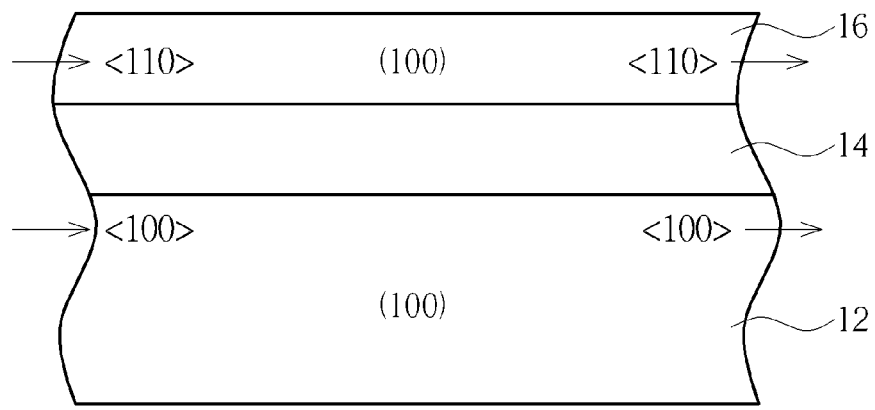

According to a preferred embodiment of the present invention, the second silicon layer 16 is rotated by 45 degrees before bonding to the dielectric layer 14, and as a result of the rotation, it is to be noted while the crystalline orientation of the first silicon layer 12 and the second silicon layer 16 both remain at (100) after the rotation, the channel direction of the second silicon layer 16 is changed from <100> to <110>. In other words, as shown in FIG. 2, after bonding the second silicon layer 16 to the dielectric layer 14 and the first silicon layer 12, the SOI structure preferably consisted of a first silicon layer 12 having crystalline orientation of (100) and channel direction of <100> while the second silicon layer 16 atop having crystalline orientation of (100) and channel direction of <110>.

Figure 3:
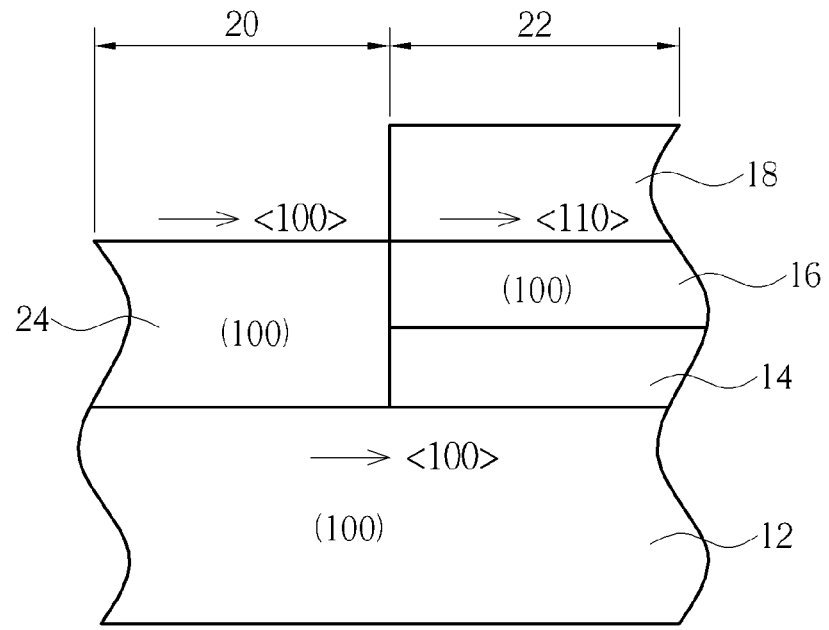

Next, as shown in FIG. 3, a patterned hard mask 18 is formed on the second silicon layer 16, and an etching process is conducted by using the patterned hard mask 18 as etching mask to remove part of the second silicon layer 16 and part of the dielectric layer 14 to define a first region 20 and a second region 22 on the first silicon layer 12, in which the remaining of the second silicon layer 16 after the etching process is on the second region 22. In this embodiment, the patterned hard mask 18 is preferably composed of silicon nitride or silicon oxide, but not limited thereto.

After part of the second silicon layer 16 and dielectric layer 14 are removed from the first region 20, an epitaxial layer 24 is grown in the first region 20 of the first silicon layer 12 while the patterned hard mask 18 is still disposed on the second silicon layer 16. The growth of the epitaxial layer 24 in the first region 20 is preferably controlled so that the top surface of the epitaxial layer 24 is substantially equal with the top surface of the second silicon layer 16, and as the epitaxial layer 24 is grown from the first silicon layer 12 having crystalline orientation of (100) and channel direction of <100>, the epitaxial layer 24 would also have the same crystalline orientation and channel direction as the first silicon layer 12, such as a crystalline orientation of (100) and channel direction of <100>. According to an embodiment of the present invention, the material of the epitaxial layer 24 could be single crystal silicon, or could be selected to accommodate the type of device which will be fabricated afterwards. For instance, if an NMOS device were to be fabricated in the first region 20, the epitaxial lay 24 is preferably composed of SiC, whereas if a PMOS device were to be fabricated in the first region 20, the epitaxial layer 24 is preferably composed of SiGe.

Figure 4:
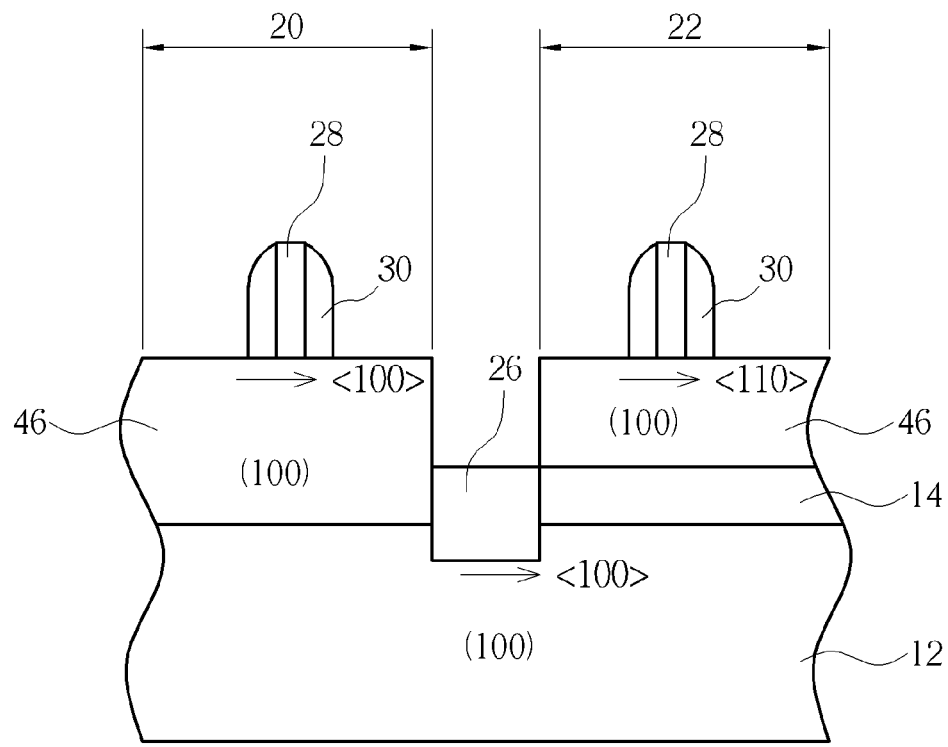

After stripping the patterned hard mask 18, as shown in FIG. 4, a FinFET process could be conducted to first define a plurality of fin-shapes structures 46 in the first silicon layer 12, the dielectric layer 14, and the second silicon layer 16 through spacer-image-transfer (SIT) process or other photo-etching processes, and then form elements such as a shallow trench isolations (STIs) 26 around the fin-shaped structures and a plurality of gate structures 28 with spacers 30 on each first region 20 and second region 22. As the FinFET process is well known to those skilled in the art, the details of which are not explained herein for the sake of brevity.

It should be noted that according to an embodiment of the present invention, in addition to prepare a substrate in the aforementioned embodiment, it would also be desirable to reverse the channel direction of two silicon layers to grow epitaxial layer with reversed channel direction.

For instance, instead of preparing a substrate with first silicon layer 12 having crystalline orientation of (100) and channel direction of <100> and second silicon layer 16 atop having crystalline orientation of (100) and channel direction of <110> as shown in FIG. 2, it would also be desirable to reverse the position of the two silicon layers 12 and 16 by preparing a first silicon layer having crystalline orientation of (100) and channel direction of <110> and a second silicon layer atop having crystalline orientation of (100) and channel direction of <100>, which is also within the scope of the present invention.

Figure 5:
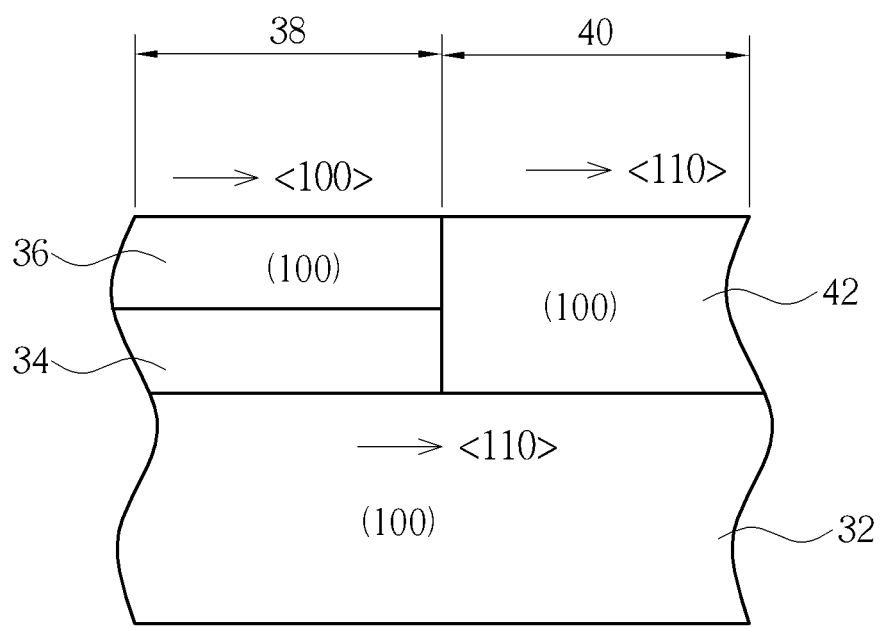
FIG. 5 illustrates a perspective view of a substrate of semiconductor device according to an embodiment of the present invention.

As shown in FIG. 5, after a substrate with first silicon layer 32 having crystalline orientation of (100) and channel direction of <110>, a dielectric layer 34, and a second silicon layer 36 atop having crystalline orientation of (100) and channel direction of <100> is prepared, part of the second silicon layer 36 and dielectric layer 34 is removed from a second region 40 by using a patterned hard mask (not shown) as mask and then an epitaxial layer 42 is grown in the second region 40 in the manner as disclosed in FIG. 3. In this embodiment, since the epitaxial layer 42 is grown from the first silicon layer 32 having crystalline orientation of (100) and channel direction of <110>, the epitaxial layer 42 would also have the same crystalline orientation and channel direction as the first silicon layer 32, such as a crystalline orientation of (100) and channel direction of <110> while the remaining second silicon layer 36 in the first region 38 would have crystalline orientation of (100) and channel direction of <100>.

Referring again to FIG. 3, which further illustrates a substrate of semiconductor device according to a preferred embodiment of the present invention. The substrate includes a first silicon layer 12 having a first region 20 and a second region 22 defined thereon, an epitaxial layer 24 on the first region 20, a dielectric layer 14 on the second region 22, and a second silicon layer 16 on the dielectric layer 14. Preferably, the second silicon layer 16, the epitaxial layer 24, and the first silicon layer 12 all have same crystalline orientation, and the epitaxial layer 24 and the second silicon layer 16 have different channel direction while the epitaxial layer 24 and the first silicon layer 12 have same channel direction. For instance, all of the second silicon layer 16, the epitaxial layer 24, and the first silicon layer 12 of the preferred embodiment were to have crystalline orientation of (100), and if the epitaxial layer 24 and the first silicon layer 12 were to have channel direction of <100>, the second silicon layer 16 would have channel direction of <110> whereas if the epitaxial layer 24 and the first silicon layer 12 were to have channel direction of <110>, the second silicon layer 16 would have channel direction of <100>.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating substrate of a semiconductor device, comprising:
   providing a first silicon layer;
   forming a dielectric layer on the first silicon layer;
   rotating a second silicon layer by 45 degrees;
   bonding the second silicon layer to the dielectric layer so that the second silicon layer and the first silicon layer comprise different channel directions;
   removing part of the second silicon layer and part of the dielectric layer to define a first region and a second region on the first silicon layer, wherein the remaining of the second silicon layer and the dielectric layer are on the second region; and
   forming an epitaxial layer on the first region of the first silicon layer, wherein the epitaxial layer and the second silicon layer comprise same crystalline orientation.

2. The method of claim 1, further comprising:
   forming a patterned hard mask on the second silicon layer after bonding the second silicon layer to the dielectric layer;
   using the patterned hard mask to remove the part of the second silicon layer and the part of the dielectric layer for defining the first region and the second region on the first silicon layer; and
   using the patterned hard mask for forming the epitaxial layer in the first region of the first silicon layer.

3. The method of claim 2, wherein the patterned hard mask comprises silicon nitride.

4. The method of claim 1, wherein the dielectric layer comprises silicon dioxide, aluminum oxide, or silicon nitride.

5. The method of claim 1, wherein the epitaxial layer comprises silicon carbide or silicon germanium.

6. The method of claim 1, wherein the epitaxial layer, the first silicon layer, and the second silicon layer comprise same crystalline orientation.

7. The method of claim 1, wherein the epitaxial layer and the second silicon layer comprise different channel directions.

8. The method of claim 1, wherein the epitaxial layer and the first silicon layer comprise same channel direction.

9. The method of claim 1, further comprising:
   removing part of the epitaxial layer and part of the second silicon layer and the dielectric layer for forming a plurality of fin-shaped structures in the first region and the second region;

forming a plurality of gate structures on the fin-shaped structures; and forming a spacer around each of the gate structures.

* * * * *